United States Patent [19]

Yamashita et al.

[11] 4,443,704

[45] Apr. 17, 1984

[54] METHOD OF ELECTRON BEAM EXPOSURE

[75] Inventors: Yoshimi Yamashita; Sumio Yamamoto, both of Yokohama, Japan

[73] Assignee: Fujitsu Limited, Kawasaki, Japan

[21] Appl. No.: 387,678

[22] Filed: Jun. 11, 1982

Related U.S. Application Data

[63] Continuation-in-part of Ser. No. 172,555, Jul. 28, 1980, abandoned.

[30] Foreign Application Priority Data

Jul. 27, 1979 [JP] Japan ................................. 54-95839

[51] Int. Cl.³ ...................... G01N 21/00; G01N 23/00
[52] U.S. Cl. ............................... 250/491.1; 250/492.2
[58] Field of Search ..................... 250/492.2, 397, 398, 250/491

[56] References Cited

U.S. PATENT DOCUMENTS 4,119,854 10/1978 Tanaka et al. ..................... 250/398
4,137,459  1/1979 Albrecht et al. ................ 250/492.2
4,199,688  4/1980 Ozasa ................................. 250/397

Primary Examiner—Bruce C. Anderson
Attorney, Agent, or Firm—Staas & Halsey

[57] ABSTRACT

A method of electron beam exposure in which a plurality of sets of reference values for setting the conditions for electron beam exposure are found in relation to a plurality of sizing marks which are successively arrayed at positions in the vicinity of the pattern area of a specimen, and the exposure condition values corresponding to registration marks on the surface of the specimen are derived from these said reference values for setting the exposure conditions.

5 Claims, 4 Drawing Figures

METHOD OF ELECTRON BEAM EXPOSURE

This is a continuation-in-part of U.S. patent application Ser. No. 172,555, filed July 28, 1980, now abandoned.

BACKGROUND OF THE INVENTION

1. Field of the Invention

The present invention relates to a method of electron beam exposure, and more specifically to a method of electron beam exposure which automatically adjusts the focal distance in the system of electron beam lenses and which also automatically adjusts the exposure conditions of the electron beam exposure. The method of electron beam exposure of the present invention can be applied during a step of electron beam exposure in the production of, for example, integrated circuit semiconductor devices.

2. Description of the Prior Art

A beam adjusting means for correction thereof has so far been employed in order to accurately impinge the beam onto the surface of a specimen, or to accurately perform beam scanning during a step of electron beam exposure. For example, reference can be made to the following literature:

- J. L. Mauer et al., "Electron Optics of an Electron-beam Lithographic System", IBM Journal of Research and Development, November, 1977.
- H. Engelke et al., "Correction of Nonlinear Deflection Distortion in a Direct Exposure Electron-beam System", IBM Journal of Research and Development, November, 1977.

According to the above-mentioned conventional methods, a focal distance in the electron beam lens system and the exposure conditions for exposing with the electron beam, are set prior to effecting the electron beam exposure. However, once such conditions have been set, it is not allowed to adjust the setting conditions until the electron beam exposure is finished over the whole specimen. In this case, the exposure conditions for electron beam exposure consist of the following three condition requirements:

(1) Field size for determining the scanning range of the electron beam.

(2) Rectangularity (orthogonality) given by an angle between the direction of longitudinal scanning and the direction of lateral scanning of the electron beam.

(3) The beam feedback value which is given by a value $K_{bf}$ having the relationship $K_{bf} = K_{dev}/\alpha$ with a value $K_{dev}$. When the spot of the beam deviates by length $\Delta x$ on the specimen due to the current I of the shifting coil 53, the relationship between $\Delta x$ and I is expressed as $I = K_{dev} \cdot \Delta x$. In the former equation, $\alpha$ is a constant determined mainly by the gain of the amplifier 89.

However, usually the semiconductor wafer used as the exposure sample is not strictly flat but is warped to some extent, or is tongued and grooved. Therefore, to expose such a semiconductor wafer to the electron beam means that resist patterns formed on the specimen undergo variations caused by the unevenness of the surface while the specimen is being exposed. Therefore, the focal distance and the electron beam exposure conditions must be constantly corrected if the specimen is to be precisely exposed. If these corrections are not made, the size and position of a resist pattern formed by the electron beam exposure become incorrect. Therefore, when a large area which requires a long exposure time is exposed by using electron beam exposure, the precision of the formed patterns is decreased. Especially, in the case of composite patterns due to the switching of the stages, the formed patterns lack precision. Consequently, it becomes difficult to form a pattern of large areas while maintaining precision. Moreover, according to conventional methods, the beam was not effectively controlled when the specimens were exposed to the electron beam, and it was difficult to suitably expose the specimens to the electron beam. The present invention is proposed in order to eliminate the above-mentioned problems inherent in the conventional methods.

SUMMARY OF THE INVENTION

The principal object of the present invention is to provide a method of electron beam exposure which is capable of accurately forming patterns of various devices such as an integrated circuit, a bubble memory, a Josephson device, and the like, by electron beam exposure even when the specimen is not strictly flat.

According to the present invention, there is provided a method of electron beam exposure, which automatically effects the focusing of an electron beam by utilizing registration marks on the surface of a specimen, characterized in a plurality of sets of reference values for setting the conditions for electron beam exposure being obtained in relation to a plurality of sizing marks which are successively arrayed at positions in the vicinity of the pattern area of the specimen. The distance between the plurality of sizing marks in the direction in which the electron beam flows is so selected as to be greater than the magnitude of variation in position on the surface of the specimen. The plural sets of reference values for setting the exposure conditions being stored in a central processing unit, and values for setting the exposure conditions corresponding to the registration marks on the surface of the specimen are fed from this central processing unit responsive to a variation in focusing which deviates from the reference values for automatically setting exposure conditions while the specimen is being exposed to the electron beam.

DESCRIPTION OF THE PREFERRED EMBODIMENT

Figure 1:
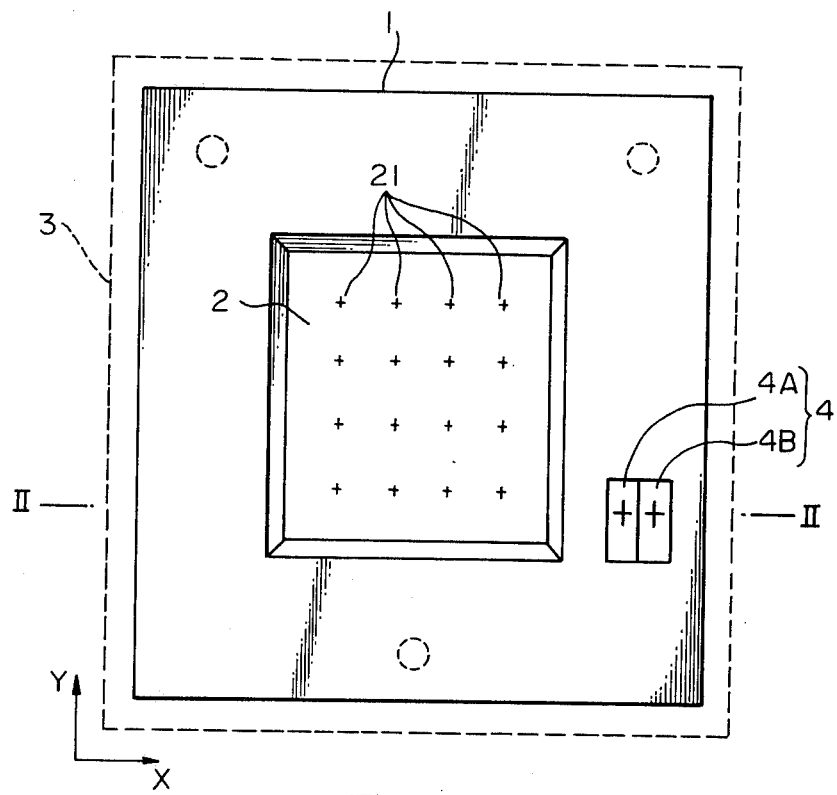
FIG. 1 is a plan view illustrating a specimen which will be exposed to an electron beam by the method of the present invention and a holder for holding the specimen.
Figure 2:
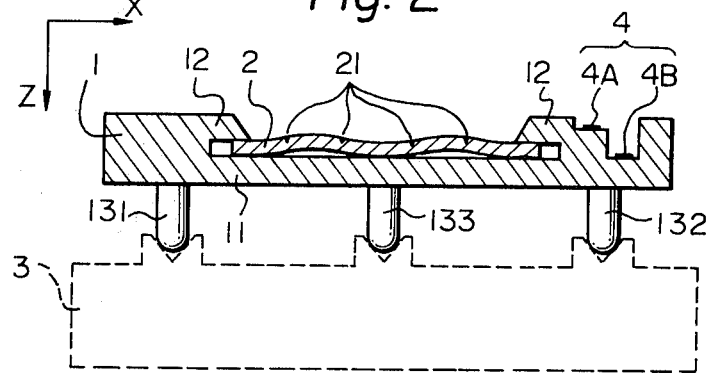
FIG. 2 is a cross-sectional view along the line II—II of FIG. 1.

FIGS. 1 and 2 illustrate a specimen which is exposed to an electron beam according to the method of the present invention, and a holder for holding the specimen. A specimen 2, such as a semiconductor wafer, is held between a lower layer portion 11 and upper edges 12 of a specimen holder 1. The specimen holder 1 is supported on a stage 3 by legs 131, 132 and 133. The stage 3 is allowed to move in the directions of an X axis and a Y axis by a positioning mechanism (not shown). The specimen 2 is usually uneven within a range of several tens of m taking into consideration the unevenness of the specimen holder, dust and contamination, or a bend of the wafer by various thermal processing.

A sizing mark portion 4 is formed in a portion of the specimen holder. The sizing mark portion 4 has two stepped surfaces; a sizing mark 4A is formed on the upper surface and a sizing mark 4B is formed on the lower surface. The distance in the vertical direction between the upper sizing mark 4A and the lower sizing mark 4B is so selected as to be greater than the range of unevenness of the upper surface of the specimen, i.e., selected to be several tens of m. A number of registration marks 21 are formed in the upper surface of the specimen 2.

Figure 3:
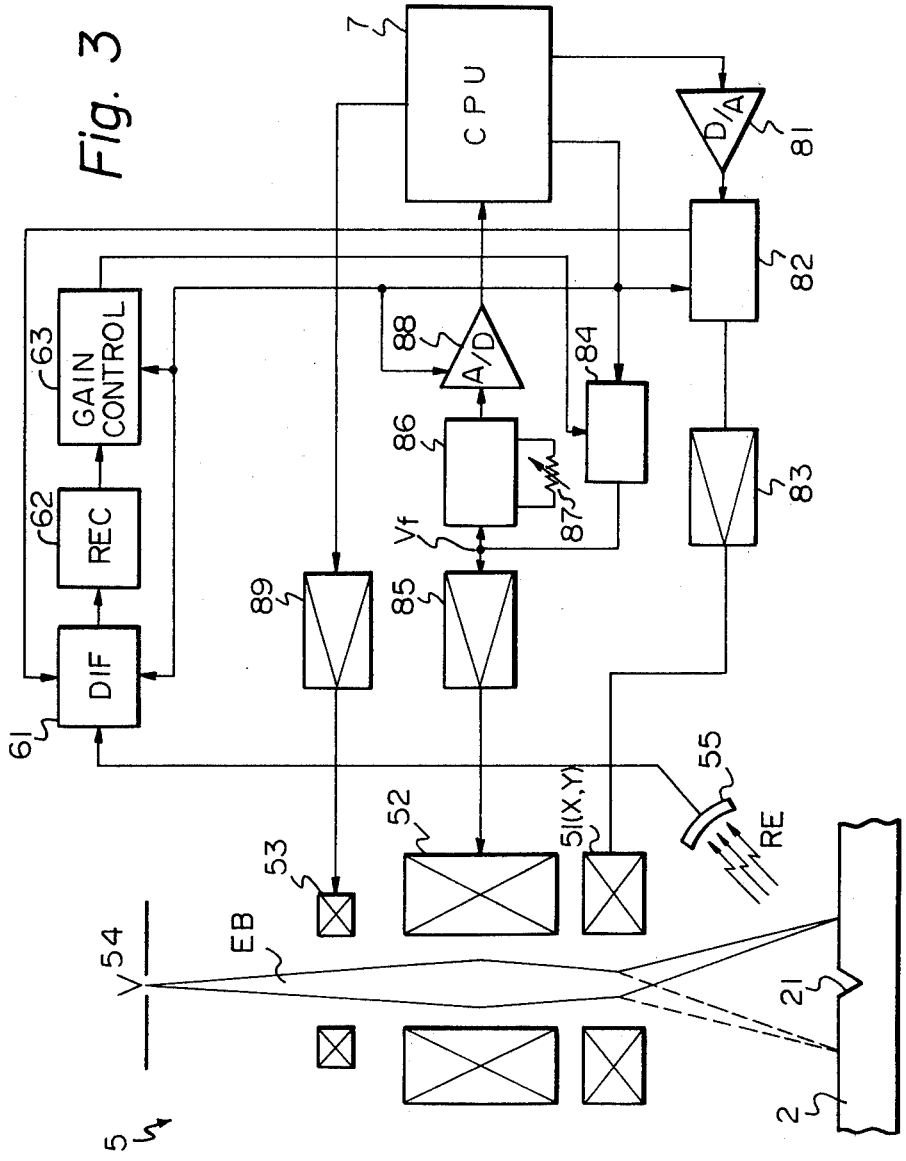
FIG. 3 is a diagram illustrating a device for irradiating an electron beam, which is used for the method of electron beam exposure of the present invention, and an electric circuit for controlling the electron beam exposure.

FIG. 3 illustrates a device for irradiating an electron beam onto the specimen 2, and an electric circuit for controlling the electron beam exposure. The specimen 2 is irradiated with an electron beam EB which is emitted from an electron gun 54 and passes through a lens system consisting of a shifting coil 53, a focusing lens coil 52 and deflector coils 51 (X, Y). Signals from a central processing unit 7 are fed to the focusing lens coil 52 via a potential circuit 84 for adjusting the focusing lens and an amplifier 85. The same signals are also fed to the deflector coils 51 (X, Y) via a D/A converter 81, an analog wave generator circuit 82 and an amplifier 83. The signals are further fed to the shifting coil 53 via an amplifier 89. The central processing unit 7 further feeds control signals to the analog wave generator circuit 82, the potential circuit 84 for adjusting the focusing lens, a differentiation circuit 61 and to gain control circuit 63. The central processing unit 7 is served with an output of an A/D converter 88 which receives the output of a voltage differential circuit 86. A detector 55 which detects electrons RE reflected by the surface of the specimen 2 which is irradiated with the electron beam EB, produces an output signal that is fed to the differentiation circuit 61. The output of the differentiation circuit 61 is fed to a rectifier circuit 62, the output of the rectifier circuit is fed to the gain control circuit 63, and the output of the gain control circuit 63 is fed to the potential circuit 84 for adjusting the focusing lens.

The specimen held by the specimen holder of FIG. 1 is exposed to an electron beam by using the control system illustrated in FIG. 3. Below is a description of the process of automatic focusing using the control system of FIG. 3.

Deflection signals are fed from the central processing unit 7 to the deflector coils 51 (X, Y) via the D/A converter 81, the analog wave generator circuit 82, and the amplifier 83, so that the electron beam EB scans the positions of predetermined marks 21. The deflection signals applied to the deflector coils 51 (X, Y) are generated by the analog wave generator circuit 82 responsive to the signals from the central processing unit 7. Therefore, the deflection signals are linear signals which do not undergo D/A conversion. With the electron beam EB being scanned in an analog manner, a higher resolution can be obtained than when an electron beam is scanned in a digital manner. Marks 21 are scanned by deflecting the electron beam EB, and reflected electrons RE are detected by the detector 55. Detection signals of the detector 55 are fed to the differentiation circuit 61, the output signals of the differentiation circuit 61 are fed to the rectifier circuit 62, and the output signals of the rectifier circuit 62 are fed to a gain control circuit 63. The output signals of the gain control circuit 63 are applied to the potential circuit 84 for adjusting the focusing lens, and a feedback function in the system is effected under a condition in which the gain is maximal. Therefore, a potential Vf for adjusting the focusing lens at the input point to the amplifier 85 is set under a condition of maximum gain.

In controlling the gain in the circuit of FIG. 3, high precision is required to determine a focal distance. In the electron beam irradiation system relying upon the device of FIG. 3, the diameter of the electron beam is about 2000 angstroms at the smallest and changes by about 1000 angstroms per 1 $\mu$m of change in the depth of focal point. The amount of the above change corresponds to several percent with respect to the diameter of the electron beam. Therefore, the focal distance can be measured by using the control circuit of FIG. 3, while maintaining a required precision.

In addition to registration marks 21 formed in the surface of the specimen as shown in FIG. 1, foreign matter attached to the specimen or dust on the surface of the specimen can also be utilized as focusing marks. Furthermore, in addition to the detector 55 for detecting reflected electrons, as illustrated in FIG. 3, a secondary electron detector may also be used as means for detecting the registration marks 21.

Below is a description of the steps of selecting reference values for setting the exposure conditions utilizing the sizing marks 4A and 4B. Among the three exposure condition requirements mentioned earlier, the field size and the rectangularity depend upon two kinds of control digital signals applied to a signal feeding circuit which supplies signals to X-direction and Y-direction deflector coils 51X and 51Y. Further, the beam feedback value depends upon a value K which is a proportional constant in a signal current fed to the shifting coil 53. In selecting the exposure condition values, firstly, an automatic focusing is carried out by using the sizing mark 4A. In this case, values of two kinds of digital signals for control as applied to a signal feeding circuit for the X-direction and Y-direction deflector coils 51X and 51Y, respectively, and a value of proportional constant K in the signal current fed to the shifting coil 53 are stored in the central processing unit 7. Then, a similar operation is carried out using the sizing mark 4B, and values corresponding to the values of the above-mentioned case of sizing mark 4A are stored in the central processing unit 7.

Figure 4:
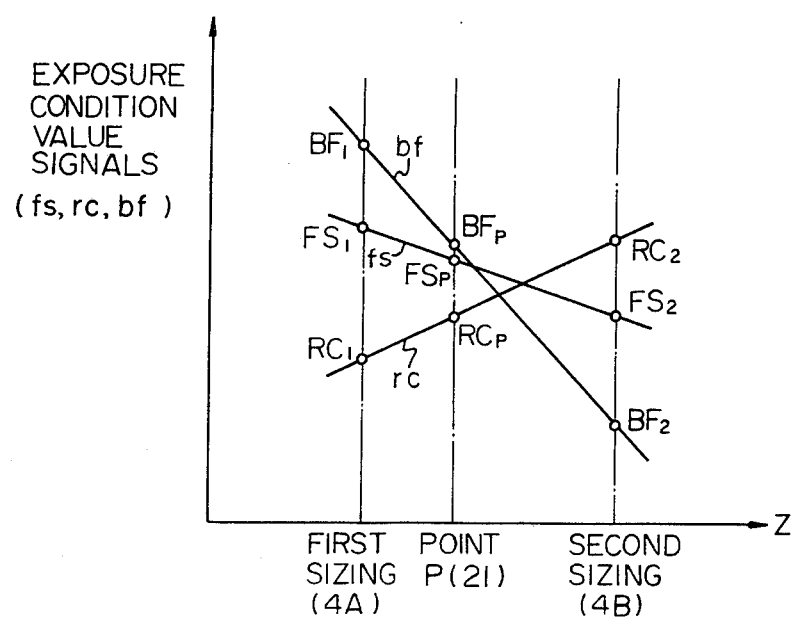
FIG. 4 is a diagram illustrating characteristics of exposure conditions according to the present invention.

The specimen 2 is exposed to the electron beam EB after the reference values for setting the exposure conditions corresponding to the two sizing marks 4A and 4B have been stored in the central processing unit 7 through the steps mentioned above. As illustrated in the diagram of FIG. 4, exposure condition value signals corresponding to the sizing mark 4A are obtained i.e., there are obtained a field size signal $FS_1$, a rectangularity signal $RC_1$ and a beam feedback value signal $BF_1$, as well as exposure condition value signals corresponding to the sizing mark 4B, i.e., a field size signal $FS_2$, a rectangularity signal $RC_2$ and a beam feedback value signal $BF_2$. It is considered that the exposure condition value signals linearly change (fs, rc, bf, respectively) at positions between the sizing marks 4A and 4B. Therefore, if a focusing mark 21 in the surface of the specimen 2 is located at a point P(21) between 4A and 4B, the exposure condition value signals at the point P(21) can be found by an interpolation method using the straight lines (fs, rc, bf). Namely, a field size signal $FS_p$, a rectangularity signal $RC_p$ and a beam feedback value signal $BF_p$ are obtained corresponding to the position P(21). In a region which includes the point P(21), therefore, the electron beam exposure is carried out by using the exposure condition value signals $FS_p$, $RC_p$ and $BF_p$ determined by the circuit of FIG. 3. In this case, an automatic focusing is carried out in the same manner as mentioned above. The exposure to the electron beam EB is controlled so that the focusing is automatically attained for each of the registration marks 21 in the specimen and the exposure condition value signals corresponding to each of the registration marks 21 are set by the central processing unit 7.

The exposure condition value signals, such as field size signal fs, rectangularity signal rc and beam feedback signal bf, are the signals representing digital values produced by the central processing unit 7. The exposure condition value signals correspond to the exposure condition requirement values explained hereinbefore. FIG. 4 is drawn for the purpose of illustrating the tendencies of the changes of the exposure condition value signals fs, rc and bf, with respect to height Z. Although such tendencies were obtained on the basis of the results of the experiment carried out by the inventors, no scales are attached to the abscissa and the ordinate of FIG. 4 because the purpose of FIG. 4 is to illustrate only such tendencies.

The process of determining the rectangularity signal and the beam feedback value signal will be explained as follows. First, position upper sizing mark 4A at the original spot of the electron beam without deviation. Then move the specimen holder in upper left direction until sizing mark 4A reaches the upper left corner position of the exposure field. Next, deflect the electron beam towards the upper left corner position, and detect the coordinates of the actually reached position of spot of the electron beam. Similarly, coordinates of the actually reached positions are detected corresponding to the lower right corner position and the lower left corner position of the exposure field, respectively. The rectangularity signal $RC_1$ is calculated from the relationship between the coordinates of the upper left corner position, the upper right corner position, the lower right corner position and the lower left corner position, and the coordinates of the actually reached positions regarding the sizing mark 4A. Similarly, the rectangularity signal $RC_2$ is calculated regarding the lower sizing mark 4B.

With regard to the beam feedback signal, first, position the upper sizing mark 4A at the original spot of the electron beam without deviation. Then move the specimen holder a small distance l, such as several micrometers. Next, deflect the electron beam by supplying the shifting coil 53 with signal $D_l$ produced by the central processing unit 7 based on the small distance l. Usually the spot of the electron beam deviated by such signal $D_l$ does not coincide with the moved sizing mark 4A because of variation of the height of the specimen. In this case it will be detected that the signal Da supplied to the shifting coil 53 causes the spot of the electron beam to actually coincide with the moved sizing mark 4A. Then the ratio $Da/D_l$ is obtained as the beam feedback value signal $BF_1$ and stored in the memory. Similarly, the beam feedback value signal $BF_2$ is obtained regarding the lower sizing mark 4B.

With the operation of the circuit of FIG. 3 being carried out, the voltage differential circuit 86 produces a signal corresponding to the difference between the input voltage and a voltage which is set by a zero-setting variable resistor 87. The output is subjected to analog-to-digital conversion by the A/D converter 88, and the thus converted digital signal is fed to the central processing unit 7 as a signal which represents varying quantity of focusing and is used for processing signals in the central processing unit 7. The central processing unit 7 feeds signals for controlling the operation timings to the analog wave generator circuit 82, to the differentiation circuit 61, to the gain control circuit 63, to the potential circuit 84 for adjusting the focusing lens and to the A/D converter circuit 88.

According to the system of FIG. 3 as mentioned above, the focusing and the exposure condition values are adjusted automatically and accurately for each relatively narrow area of the specimen having an uneven surface by utilizing the exposure condition values corresponding to the sizing marks 4A and 4B which are stored in the central processing unit 7.

In the above-mentioned embodiments, although two stages of sizing marks 4A and 4B are employed, it is of course allowable to use sizing marks of three or more stages. When sizing marks of three or more stages are employed, the lines representing the change in the exposure conditions of FIG. 4 become curves instead of straight lines and the precision of exposing patterns is increased. Furthermore, although the above-mentioned embodiment has dealt with the control of electron beam exposure by an interpolation method, it is of course allowable to control the electron beam exposure by an extrapolation method by suitably modifying the device.

We claim:

1. A method of electron beam exposure, which automatically effects the focusing of an electron beam by utilizing registration marks on the surface of a specimen, characterized in that plural sets of reference values for setting the conditions for electron beam exposure are obtained in relation to a plurality of sizing marks which are successively arrayed at positions in the vicinity of the pattern area of the specimen, the distance between said plurality of sizing marks in the direction in which the electron beam flows is so selected as to be greater than the magnitude of variation in position on the surface of said specimen, said plural sets of reference values for setting the exposure conditions are stored in a central processing unit, exposing said specimen to an electron beam, detecting bounced signals from the registration marks on the specimen during the actual beam exposure, and setting the exposure conditions corresponding to the registration marks on the surface of the specimen being fed from said central processing unit responsive to variation in focusing which deviates from said reference values for setting exposure conditions when said specimen is being exposed to the electron beam.

2. A method as set forth in claim 1, wherein the exposure condition values consist of a field size in the electron beam exposure, a rectangularity and a beam feedback value.

3. A method as set forth in claim 2, wherein the exposure conditions are determined by two kinds of digital signals for control which are used for obtaining signals that are to be fed to X-direction and Y-direction deflector coils, and by selecting a proportional constant which determines a value to be fed to a shifting coil.

4. A method of automatically focusing an electron beam while exposing by said electron beam a semiconductor device which is not strictly flat comprising:
(a) providing registration marks in a pattern area on the surface of a semiconductor specimen;
(b) further providing a plurality of sizing marks adjacent to the pattern area, wherein the distance between said plurality of sizing marks and the direction in which the electron beam flows is so selected as to be greater than the magnitude of variation in vertical position of the upper surface of said specimen;
(c) obtaining exposure reference values by using said plurality of sizing marks;
(d) storing said reference values in a central processing unit;
(e) exposing said specimen to an electron beam;
(f) detecting bounced signals from the registration marks on the specimen during the actual beam exposure;
(g) determining the depth of the registration mark in accordance with said detected bounced signals;
(h) calculating exposure condition values corresponding to the depth of the registration mark using said determined depth; and
(i) carrying out an electron beam exposure on said specimen in accordance with said calculated exposure condition values.

5. A method as set forth in claim 4, wherein the exposure reference values include values representing field size, rectangularity, and beam feedback.

* * * * *